(12) United States Patent  
Kageyama

(10) Patent No.: US 9,888,189 B2  
(45) Date of Patent: Feb. 6, 2018

(54) IMAGE CAPTURING APPARATUS AND STORAGE MEDIUM FOR STORING IMAGE CAPTURING CONTROL PROGRAM

(71) Applicant: CANON KABUSHIKI KAISHA, Tokyo (JP)

(72) Inventor: Takashi Kageyama, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 25 days.

(21) Appl. No.: 15/091,334

(22) Filed: Apr. 5, 2016

(65) Prior Publication Data

US 2016/0295136 A1 Oct. 6, 2016

(30) Foreign Application Priority Data

Apr. 6, 2015 (JP) .................................. 2015-077317

(51) Int. Cl.
| | |
|---|---|
| *H04N 5/225* | (2006.01) |
| *H04N 5/353* | (2011.01) |
| *H04N 5/378* | (2011.01) |
| *H04N 5/232* | (2006.01) |
| *H04N 5/235* | (2006.01) |
| *H04N 5/345* | (2011.01) |

(Continued)

(52) U.S. Cl.
CPC ........... *H04N 5/353* (2013.01); *H04N 5/2351* (2013.01); *H04N 5/2353* (2013.01); *H04N 5/2354* (2013.01); *H04N 5/23212* (2013.01); *H04N 5/345* (2013.01); *H04N 5/3696* (2013.01); *H04N 5/378* (2013.01); *H04N 5/37457* (2013.01)

(58) Field of Classification Search
CPC .. H04N 1/6086; H04N 5/2256; H04N 5/2354; H04N 5/2351; H04N 5/247; H04N 5/3415

See application file for complete search history.

(56) References Cited

U.S. PATENT DOCUMENTS 6,564,014 B1 * 5/2003 Takeuchi ................. G03B 7/16  
396/157  
2001/0033333 A1 * 10/2001 Suzuki ............. H01L 27/14609  
348/220.1

(Continued)

FOREIGN PATENT DOCUMENTS

JP 2007-235893 A 9/2007  
JP 2013-059082 A 3/2013

*Primary Examiner* — Dwight C Tejano  
(74) *Attorney, Agent, or Firm* — Cowan, Liebowitz & Latman, P.C.

(57) ABSTRACT

An image capturing apparatus includes a light emission controller configured to make a light emitter provide a first light emission and a second light emission with a light emission amount calculated based on a result of photometry in the first light emission, the light emitter being configured to emit illumination light of the object field, and a switch configured to switch a readout of an exposure control signal between first and second signal readouts to obtain a result of the photometry in the first light emission. In the first signal readout signals from a plurality of photoelectric conversion elements are synthesized and read out. In the second signal readout, an output of a first photoelectric conversion element is read out among a plurality of photoelectric conversion elements in an image sensor and then an output of a second photoelectric conversion element is read out.

6 Claims, 12 Drawing Sheets

(51) Int. Cl.
*H04N 5/369* (2011.01)
*H04N 5/3745* (2011.01)

(56) References Cited

U.S. PATENT DOCUMENTS

| | | | | |
|---|---|---|---|---|
| 2002/0085100 | A1* | 7/2002 | Takahashi | H04N 9/045 348/223.1 |
| 2004/0240868 | A1* | 12/2004 | Iwasaki | G03B 7/16 396/56 |
| 2005/0122409 | A1* | 6/2005 | Takeshita | H04N 1/6027 348/223.1 |
| 2005/0179810 | A1* | 8/2005 | Okamura | H04N 5/2354 348/371 |
| 2005/0219666 | A1* | 10/2005 | Ejima | H04N 5/232 358/539 |
| 2012/0194732 | A1* | 8/2012 | Masuda | H04N 5/2256 348/371 |
| 2013/0076972 | A1* | 3/2013 | Okita | H04N 5/23212 348/360 |
| 2013/0335608 | A1* | 12/2013 | Kono | H04N 5/235 348/302 |
| 2014/0192248 | A1* | 7/2014 | Kishi | H04N 5/23212 348/345 |

* cited by examiner

IMAGE CAPTURING APPARATUS AND STORAGE MEDIUM FOR STORING IMAGE CAPTURING CONTROL PROGRAM

BACKGROUND OF THE INVENTION

Field of the Invention

The present invention relates to an image capturing apparatus, such as a digital camera, and more particularly to image capturing control in flash photography in the image capturing apparatus configured to acquire phase difference information using an image sensor.

Description of the Related Art

In the flash photography in which an image is captured with flashlight emission that illuminates an object, it is necessary to precisely control a flashlight emission amount (or an irradiation light amount onto the object). In order to calculate a light emission amount in the main light emission in capturing an (or for exposure control), the pre-light emission (or pre-flash) is performed prior to the main light emission, and the light reflected from the object in the pre-light emission is often measured. Japanese Patent Laid-Open No. ("JP") 2007-235893 discloses a precise exposure control method of the main light emission using the pre-light emission even in a scene with bright external light (so-called fill-in flash capturing).

The method disclosed in JP 2007-235893 uses an image sensor in which electric charge resetting and reading timings are different for each line, and an exposure period of an initial reading line and an exposure period of a final reading line partially overlap each other. A shift between the exposure timing of the initial reading line and the exposure timing of the final reading line is reduced by increasing the thinning number of reading lines.

An image sensor used for an image capturing apparatus can include a plurality of micro lenses, and a plurality of photoelectric conversion elements assigned to each micro lens. This type of image sensor can provide a plurality of (phase difference image) signals having a phase difference according to a focusing state of a capturing optical system, and the phase difference autofocus ("AF") using the phase difference. In the flash photography using the image capturing apparatus having this image sensor, the phase difference AF information can be utilized to improve the precision of extracting the main object area to which the luminance is to be appropriately set. JP 2013-59082 discloses a method for acquiring a distance distribution for each area in the object image using a pair of phase difference image signals, and for reducing uneven flashlight distribution using this distance distribution information.

However, it takes a long time to read the signals separately out of the plurality of photoelectric conversion elements provided for each micro lens, in order to acquire a pair of phase difference image signals in the pre-light emission. As a result, it takes a long time to read the signal per one line. As a solution for this problem, as disclosed in JP 2007-235893, if the line thinning number is increased so that the exposure period of the initial reading line and the exposure period of the final reading line can partially overlap each other, the number of pixels in the image obtained by reading the signal is reduced and the photometric precision is lowered. As a result, an appropriate exposure control cannot be obtained.

SUMMARY OF THE INVENTION

The present invention provides an image capturing apparatus etc. configured to utilize phase difference AF information obtained in a pre-light emission and to provide good exposure control in a variety of scenes by selecting driving of an image sensor and exposure control according to flash photography scenes or situations.

An image capturing apparatus according to the present invention includes an image capturer having a plurality of pixels each including a plurality of photoelectric conversion elements for each micro lens, a reader configured to read a signal from the pixel by a first signal readout in which signals from the plurality of photoelectric conversion elements are synthesized and read out, and a second signal readout in which an output of a first photoelectric conversion element is read out among the plurality of photoelectric conversion elements and then an output of a second photoelectric conversion element is read out, a photometer configured to provide photometry using a signal read out of at least a part of pixel area that has received light from an object field, a light emission controller configured to make a light emitter provide a first light emission and a second light emission with a light emission amount calculated based on a result of the photometry in the first light emission, the light emitter being configured to emit light to illuminate the object field, and a switcher configured to switch a readout of an exposure control signal from the pixel area, between the first signal readout and the second signal readout so as to obtain a result of the photometry in the first light emission.

Further features of the present invention will become apparent from the following description of exemplary embodiments with reference to the attached drawings.

DESCRIPTION OF THE EMBODIMENTS

A description will now be given of one embodiment according to the present invention with reference to the accompanying drawings.

Figure 1:
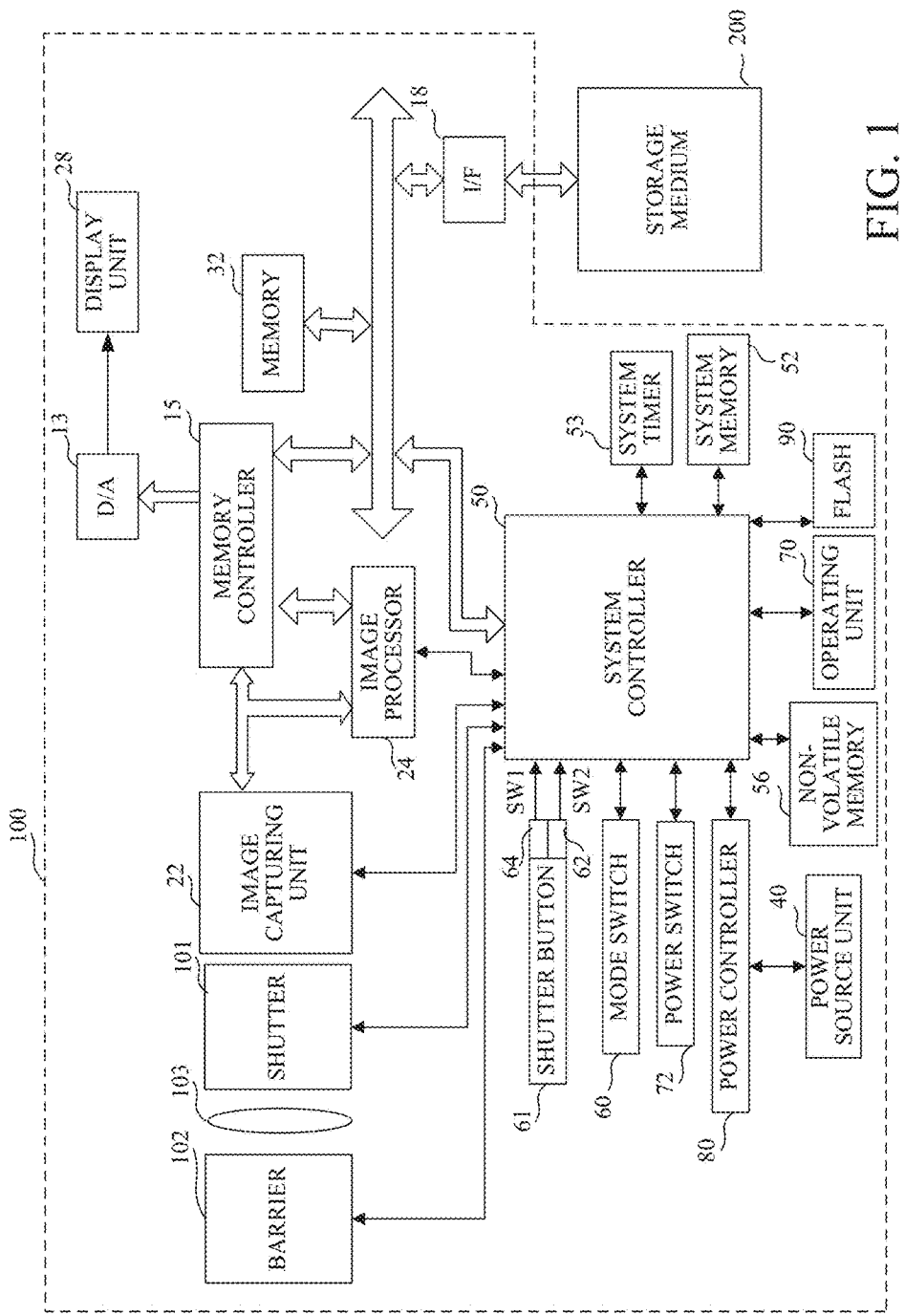
FIG. 1 is a view illustrating a digital camera according to an embodiment of the present invention.

FIG. 1 illustrates a structure of a digital camera (simply referred to as a "camera" hereinafter) 100 as an image capturing apparatus according to this embodiment of the present invention. In FIG. 1, an image capturing lens (image capturing optical system) 103 includes a magnification varying lens and a focus lens. A shutter 101 has a diaphragm function in addition to a shutter function.

An image capturing unit 22 includes an image sensor, such as a CCD sensor and a CMOS sensor, configured to convert an object image as an optical image formed by the image capturing lens 103 into an electric signal. A detailed description of the image sensor will be given later. The image capturing unit 22 has an A/D conversion function configured to convert an analogue electric signal output from the image sensor into a digital signal (which will be referred to as an "image signal" hereinafter). The capturing unit 22 serves as an image capturer.

A barrier 102 covers a front surface of the image capturing lens 103, and prevents an image capturing system including the image capturing lens 103, the shutter 101, the image capturing unit 22 from being contaminated or broken.

A flashlight emitter 90 emits light in capturing an image, and compensates the luminance in the object field in capturing an image in a low illuminance scene and a backlight scene.

The image processor 24 generates image data through image processing, such as the pixel interpolation, reduction, other resizing, and color conversion, to the image signal output from the image capturing unit 22 and the input signal from the memory controller 15. The image processor 24 provides calculation processing for exposure control and AF control using the image signal obtained by the image pickup. The system controller 50 provides, based on the calculation result in the image processor 24, a TTL (through-the-lens) auto-exposure ("AE") processing, EF (automatic electronic exposure light emission) processing, and AF processing.

The image processor 24 also provides TTL auto-white balance ("AWB") processing using the calculation result of the image signal obtained by the image pickup.

The image signal output from the image capturing unit 22 is written in a memory 32 via the image processor 24 and memory controller 15 or only through the memory controller 15. The memory 32 stores the image signal obtained and A/D converted by the image capturing unit 22 and image data generated by the image processor 24. The memory 32 has a storage capacity enough to store the predetermined number of still images, motion images and voices for a predetermined time period. The memory 32 serves as a (video) memory for displaying an image.

A D/A converter 13 converts image data stored in the memory 32 into an analogue signal and supplies the analogue signal to a display unit 28. Thus, the image data written in the memory 32 is displayed on the display unit 28 via the D/A converter 13. The display unit 28 displays an image on a display device, such as an LCD.

The digital signal once A/D converted by the image capturing unit 22 and stored in the memory 32 is converted into an analogue signal by the D/A converter 13, and the analog signal is sequentially transferred to the display 28, and displayed as an image there. Thereby, an electronic viewfinder is configured to display a live-view image.

A non-volatile memory 56 is an electrically erasable and recordable memory, and can use a flash memory, etc. The non-volatile memory 56 stores a computer program and a constant for operating the system controller 50.

The system controller 50 is a microcomputer configured to control the entire camera 100. The system controller 50 executes the computer program stored in the non-volatile memory 56 for the following processing. The system controller 50 serves as a reader, a photometric unit, a light emission controller, and a switcher. The system controller 50 also serves as an exposure controller and a focus information acquirer.

The system memory 52 is a RAM, and develops operational constants and variables for the system controller 50, and a program read out of the non-volatile memory 56. The system controller 50 controls the memory 32, D/A controller 13, the display unit 28, etc., and provides display control.

A system timer 53 is a timekeeper configured to measure a time period for each control and the time of a built-in clock.

Each of the mode switch 60, the first shutter switch 62, a second shutter switch 64, and an operating unit 70 are an operating unit into which a user inputs a variety of operating commands to the system controller 50.

The system controller 50 switches an operation mode among a still image capturing mode, a motion image capturing mode, and a reproduction mode according to the operation of the mode switch 60.

A first shutter switch 62 is turned on by a first stroke (half-pressing operation) of the shutter button 61 and generates a SW1 signal. The system controller 50 that receives the SW1 signal starts an image capturing preparing operation such as the AF processing, the AE processing, the AWB processing, and EF processing.

A second shutter switch 64 is turned on by a second stroke (fully pressing operation) of the shutter button 61 and generates a SW2 signal. The system controller 50 that receives the SW2 signal starts a series of image capturing operation from reading the signal from the image capturing unit 22 to writing the image data into the storage medium 200.

The operating unit 70 contains a variety of switches, dials, and icons on a touch panel on the display unit 28, and enables inputs and settings when operated.

A power switch 72 is operated by the user so as to turn on and off a power source of the camera 100.

A power controller 80 detects whether a battery is attached to the power source unit 40, a type of the battery, and a remaining amount of the battery. The power controller 80 supplies a necessary voltage to the storage medium 200 for a necessary period.

A storage medium I/F 18 is an interface with a storage medium 200, such as a memory card and a hard disk drive. The storage medium 200 is a recording medium, such as a memory card, for recording image data obtained through image pickup, and can include a semiconductor memory, a magnetic disk, etc.

Figures 2A, 2B, 2C:
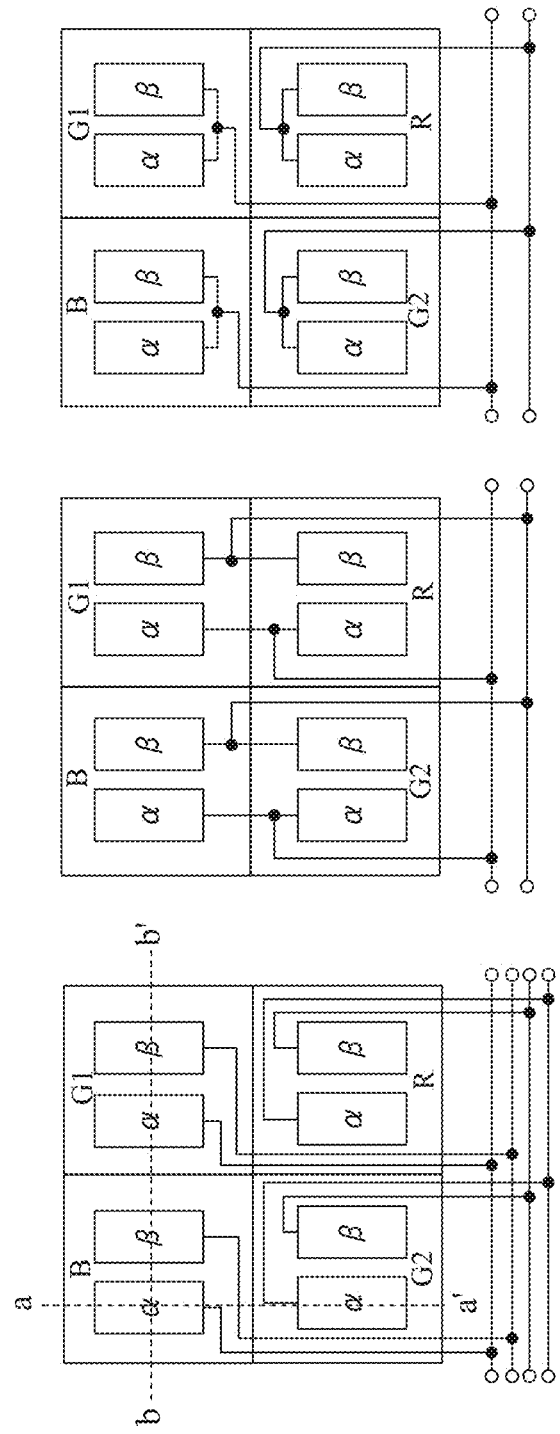
FIGS. 2A-2C are plane views of image sensors used to the digital camera according to this embodiment.
Figure 3A:
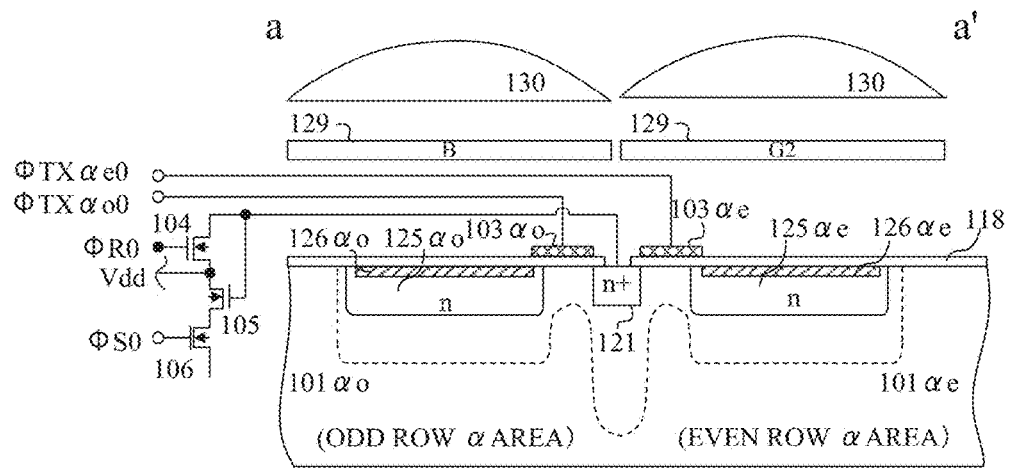
FIGS. 3A and 3B are sectional views taken along lines a-a' and b-b' in the image sensor illustrated in FIG. 2A.
Figure 3B:
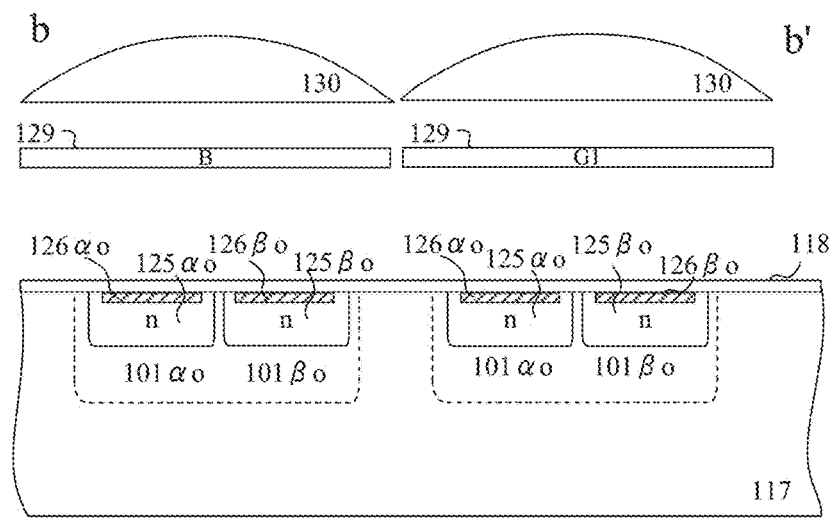

FIGS. 2A-2C illustrate pixel structures of the image sensor 10 provided on the image capturing unit 22. In these figures, 2 rows times 2 columns or four pixels (R, G1, G2, and B) are arranged as the Bayer arrangement, and a plurality of (or two) photoelectric conversion elements α and β are provided to each pixel. FIGS. 3A and 3B illustrate sections taken along a-a' line and b-b' line in FIG. 2A. A single micro lens 130 is provided to each of the plurality of pixels in the image sensor 10 or the pair of photoelectric conversion elements α and β. Due to the micro lens 130, a pair of object images (A image and B image) are formed as if they are viewed from viewpoints that are different from each other. In FIGS. 3A and 3B, components of the photoelectric conversion elements α and β are affixed by α and β, and the components of the photoelectric conversion elements α and β in the pixel that constitutes the pixel lines (which will be simply referred to as a "line" hereinafter) in odd and even rows in the image sensor 10 are affixed by o and e. An "A" image signal (first image signal) is obtained by photoelectrically converting the A image from a plurality of photoelectric conversion elements affixed by $\alpha$ (referred to as "photoelectric conversion elements $\alpha$" hereinafter). A "B" image signal (second image signal) is obtained by photoelectrically converting the B image from a plurality of photoelectric conversion elements affixed by $\beta$ (referred to as "photoelectric conversion elements $\beta$" hereinafter).

In FIGS. 3A and 3B, reference numeral 117 denotes a p-type well formed in a substrate, and reference numeral 125 is an n-type region configured to generate and store photo-electric charges with the p-type well 117. Reference numeral 121 is a floating diffusion part (referred to as an "FD part" hereinafter) to which the photoelectric charges stored in the n-type region 125 are transferred. Reference numeral 126 is a surface p+ layer configured to collect the photoelectric charges so as to efficiently transfer the photoelectric charges stored in the n-type region 125 to the FD part 121. Reference numeral 103 is a transfer gate used to transfer the photo-electric charges to the FD part 121. Reference numeral 118 is a SiO$_2$ film as a gate insulating film. Reference numeral 129 denotes color filters R, G1, G2, and B for the Bayer arrangement.

The shape and position of the micro lens 130 are set so that the pupil of the image capturing lens 103 and the photoelectric conversion elements $\alpha$ and $\beta$ in the image sensor 10 have a conjugate relationship. Reference numeral 101 denotes a schematic area used to generate the photo-electric charge.

In FIGS. 3A and 3B, reference numeral 104 is a resetting MOS transistor configured to reset the FD part 121 etc. to the reset potential (Vdd) according to a reset pulse $\Phi$R0. Reference numeral 105 denotes a source follower amplifier MOS transistor configured to obtain an amplification signal based on the photoelectric charges transferred to the FD part 121. Reference numeral 106 denotes a horizontal selection switch MOS transistor configured to read out an amplified signal obtained by the source follower amplifier MOS transistor 105 to a vertical output line. The transfer gate 103 is independently controllable by control pulses $\Phi$TX$\alpha$e0 and $\Phi$TX$\alpha$o0.

Figure 4:
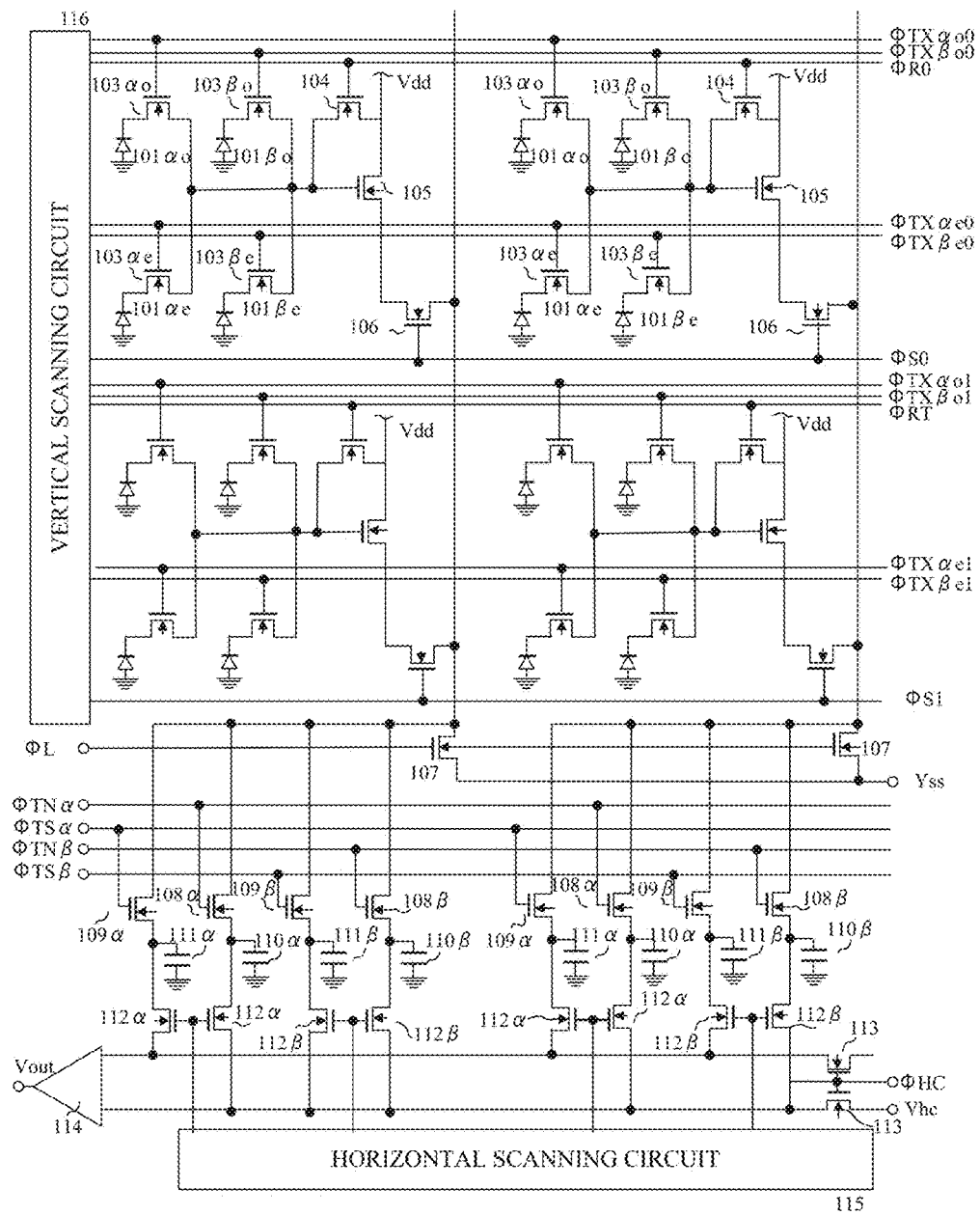
FIG. 4 is a view illustrating a circuit structure of the image sensor illustrated in FIG. 2A.

FIG. 4 illustrates a circuit configuration in the image sensor 10 having the pixel structure illustrated in FIG. 2A. In FIG. 4, reference numeral 107 is a load MOS transistor of the source follower, and reference numeral 108 denotes a dark output transfer MOS transistor. Reference numeral 109 denotes a bright output MOS transistor, and reference numeral 110 denotes a dark output storage capacity CTN. Reference numeral 111 denotes a bright output storage capacity CTS, and reference numeral 112 denotes a horizontal transfer MOS transistor. Reference numeral 113 denotes a horizontal output line reset MOS transistor, and reference numeral 114 denotes a differential output amplifier. Reference numeral 115 denotes a horizontal scanning circuit, and reference numeral 116 denotes a vertical scanning circuit.

Figure 5:
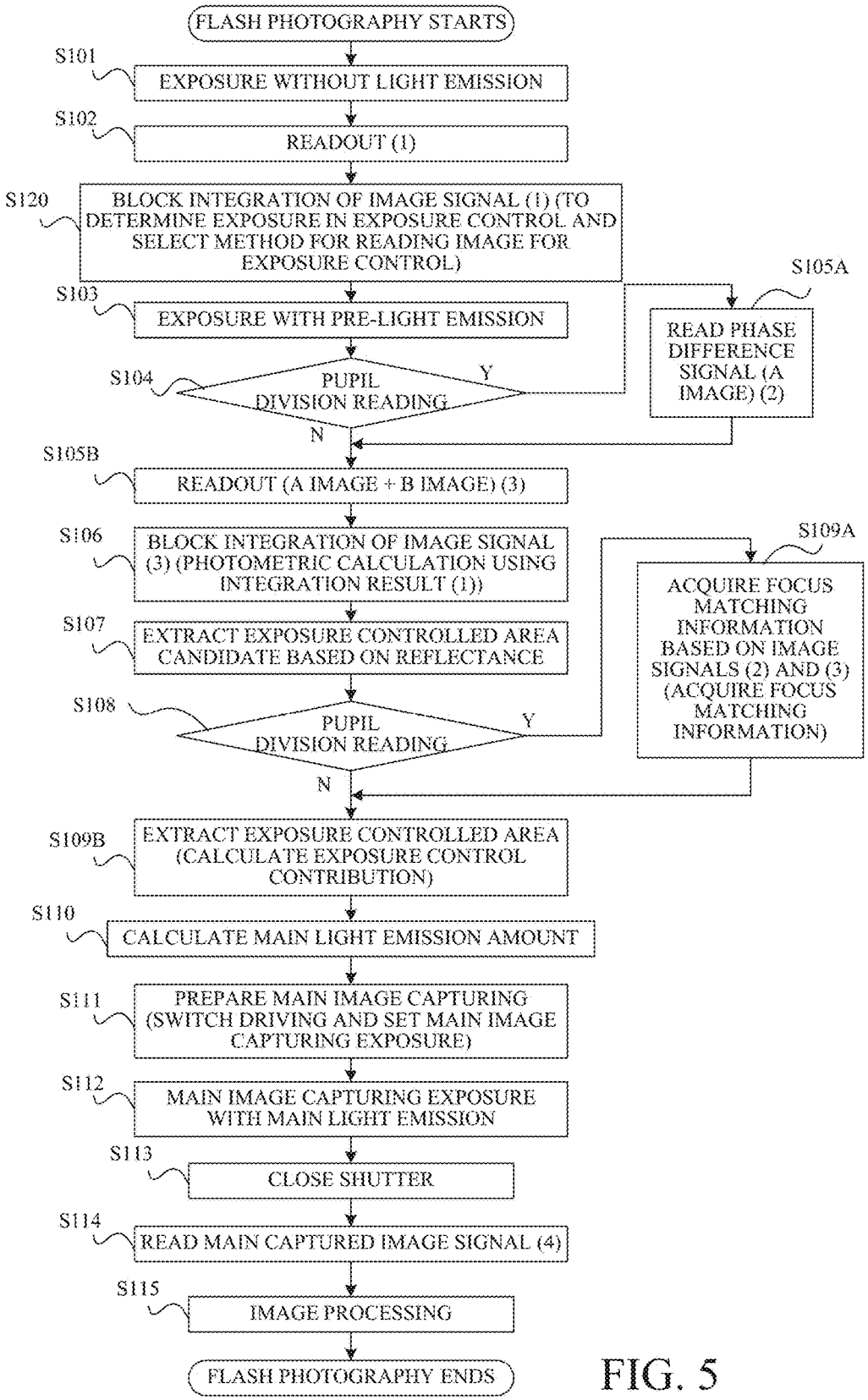
FIG. 5 is a flowchart illustrating flash photography control processing according to this embodiment.
Figure 6:
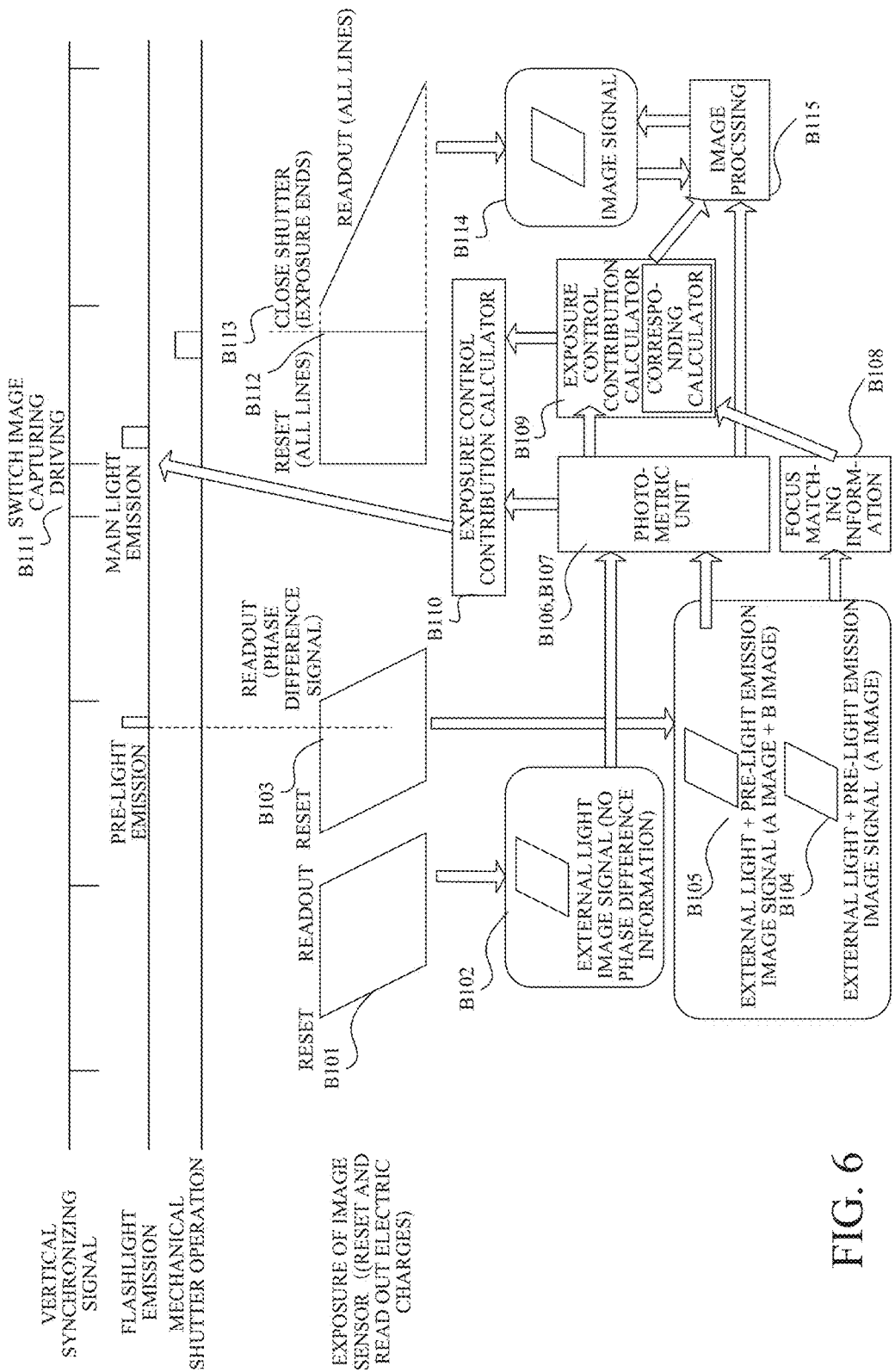
FIG. 6 is a timing chart in the flash photography according to this embodiment.

The flowchart illustrated in FIG. 5 indicates a flow of the flash photography control processing in the still image capturing mode performed by the system controller 50 in this embodiment. "S" stands for the step (processing). The system controller 50 executes this flash photography control processing according to a flash photography control program as a computer program. FIG. 6 illustrates a timing chart of a flash photography operation controlled by this processing. FIG. 6 also illustrates the flow of an operation relating to the exposure of the image capturing unit 22 (image sensor 10) (charge resetting and signal readout). Bnnn indicates an operation corresponding to the step Snnn in FIG. 5.

The system controller 50 that has performed the AF processing according to the SW1 signal from the first system switch 62 starts the main processing in response to the SW2 signal input from the second shutter switch 64.

In S101, the system controller 50 exposes the image capturing unit 22 without making the flashlight emitter 90 emit the light (in the non-light emission) so as to measure the external light amount.

Next, in S102, the system controller 50 reads the image signal from the image capturing unit 22 so as to obtain the photometric result in the non-light emission of the flashlight emitter 90. Herein, the A+B image signals are read out as an image signal that is made by adding (synthesizing) the A image signal and the B image signal to each other, where the A image signal is obtained from the photoelectric conversion elements $\alpha$ and the B image signal is obtained from the photoelectric conversion elements $\beta$ as illustrated in FIGS. 2A and 2B. Herein, reading this image signal (although it is indicated as circled 1 in FIG. 5 hereinafter) will be referred to as readout (1).

Next, in S120, the system controller 50 performs a block integration of the image signal obtained by the readout (1), and performs the photometric operation or calculates the luminance level for each block based on the result of the block integration. The system controller 50 determines exposure (or in the exposure control) when the system controller 50 makes the flashlight emitter 90 perform a pre-light emission as the first light emission based on the photometric operation according to the known algorithm and chart. This determine exposure is a light emitting amount and a light emission time period (exposure time).

The system controller 50 switches (or selectively set) the reading method of the image signal from the image capturing unit 22 in the exposure control (exposure controlling signal) according to the determined exposure in the exposure control (exposure time period).

More specifically, when the exposure time period of the pre-light emission is shorter than a predetermined time period (when the photometric result in S120 is bright), the first reading method (first signal readout) is selected as the reading method. The first reading method is a method for reading only the A+B signal that is made by adding (synthesizing) the A image signal obtained by the photoelectric conversion elements $\alpha$ and the B image signal obtained by the photoelectric conversion elements $\beta$ to each other, similar to S102. This reading method will be referred to as pupil integration reading.

On the other hand, the system controller 50 selects the second reading method (second signal readout) as the reading method when the exposure time period in the determined pre-light emission is longer than the predetermined time period (when the photometric result in S120 is dark). In the second reading method, the A+B image signal is read out after the A image signal is read out, and this method will be referred to as pupil division reading. A description will be given of a reason why the pupil division reading is performed, with reference to FIGS. 11A, 11B, 12A, and 12B.

Figure 11A:
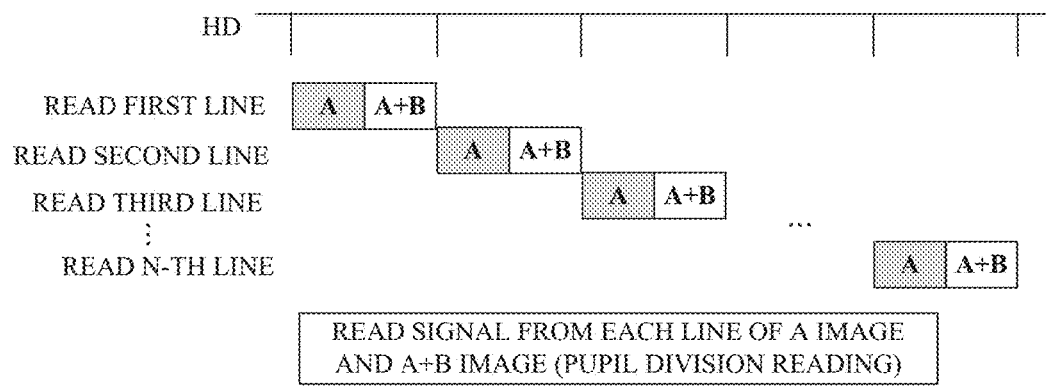
FIGS. 11A and 11B are views for explaining a signal reading period according to a signal reading method in an image capturing unit in the digital camera according to this embodiment.
Figure 11B:
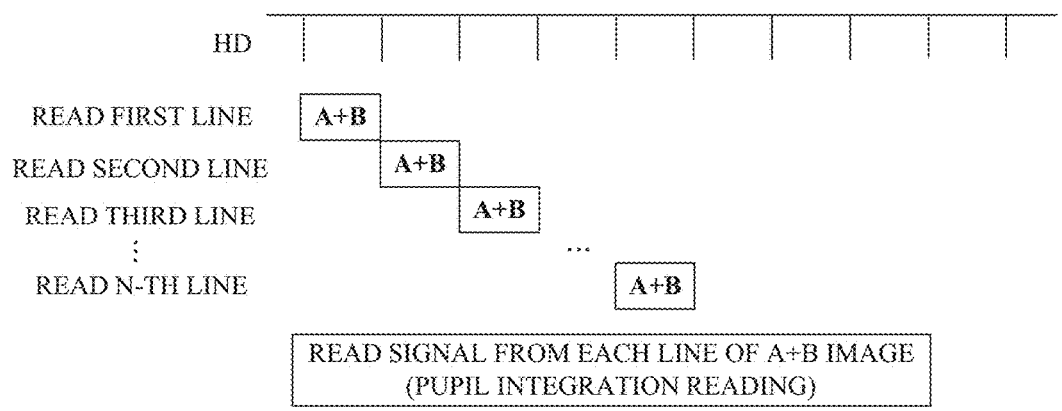

FIG. 11A illustrates the readout timing for each line (pixel area) in the image capturing unit 22 in the pupil division reading. FIG. 11B illustrates the readout timing for each line in the image capturing unit 22 in the pupil integration reading. Since the signal transmission line (wiring) from the image capturing unit 22 to the image processor 24 or the memory controller 15 cannot be changed, a time period used to transfer the image signal as a digital signal is constant unless the bit number of the digital signal is changed. Therefore, the pupil division reading requires a time period twice as long as the pupil integration reading. This causes the following problem when the flashlight emitter 90 performs the pre-light emission and irradiates the light for the exposure period of the image capturing unit 22.

Figure 12A:
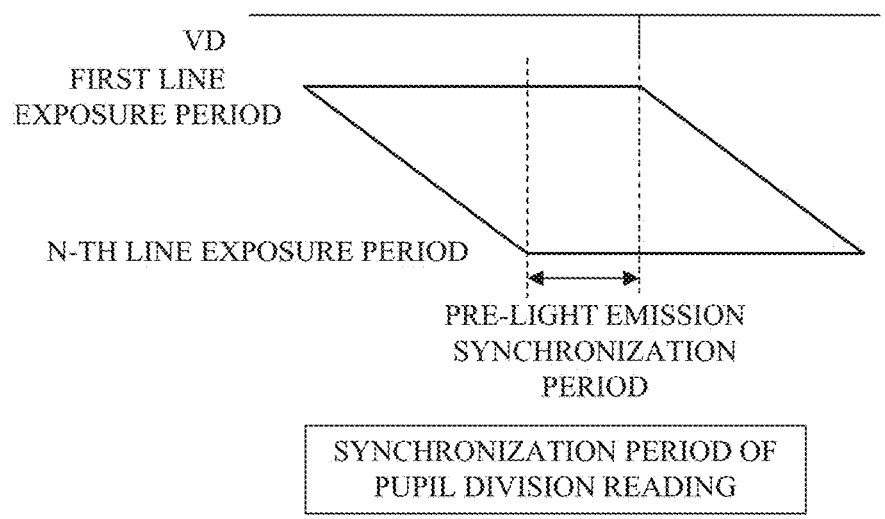
FIGS. 12A and 12B are views for explaining a synchronization period between the flashlight emission and the exposure of the image sensor in the digital camera according to this embodiment.
Figure 12B:
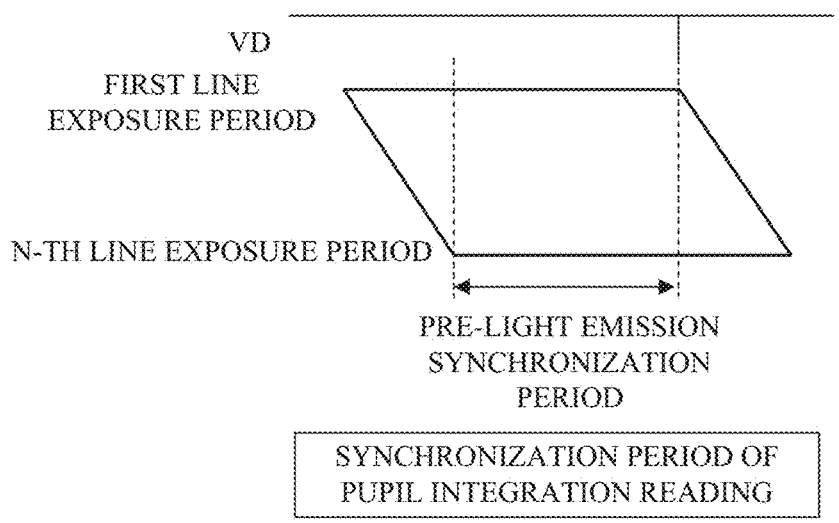

FIG. 12A illustrates a synchronization period in the pupil division reading in the pre-light emission. FIG. 12B illustrates a synchronization period in the pupil integration reading in the pre-light emission. The synchronization period is a period used to expose the entire surface of the image sensor with the reflected light emitted from the flashlight emitter 90 in the object field. When the light is emitted outside this period, only part of the image sensor is exposed by the reflected light. As understood from these figures, when the exposure time period of the image capturing unit 22 is the same, a period in which the light emission of the flashlight emitter 90 can be synchronized with the exposure period in the pupil division reading is shorter than a period in which the light emission of the flashlight emitter 90 can be synchronized with the exposure period in the pupil integration period. Thus, the image capturing unit 22 switches the reading method of the image signal according to the exposure period in the exposure control.

In FIGS. 11A and 11B, the pupil integration reading or the pupil integration reading is selected for the entirety (all lines) of the image capturing unit 22, but the pupil integration reading and the pupil integration reading can be switched for each line. Since the pupil division reading is necessary only for the object field area onto which the light from the flashlight emitter 90 is irradiated with a proper illuminance, the pupil division reading is performed except for the unnecessary area, using in-focus information at timing before the object extracting and image capturing sequence is started by the known algorism. This case may limit an effect of extending the synchronization period in the pre-light emission illustrated in FIG. 12B through the pupil integration reading of all lines in the pre-light emission.

Nevertheless, the pupil division reading can provide an effect of enriching scenes to which the exposure controlled area extraction is applicable using the following focus matching information. Thus, this embodiment determines the lines for the pupil division reading based on the in-focus information at timing before the object extracting and image capturing sequence is started by the known algorithm and the illuminance of the object field.

Herein, the pupil division reading and the pupil integration reading may be switched according to the area setting in the configuration of the image capturing unit 22, for instance, for each block (pixel area) for the block integration, rather than for each line. The line and block for which the pupil division reading and the pupil integration reading are switched may be at least part of the pixel area in the image sensor.

The system controller 50 may select the pupil integration reading when the luminance level is higher than the predetermined luminance for each block calculated in S120, and the pupil division reading when the luminance level is lower than the predetermined luminance.

Turning back to FIG. 5, in S103, the system controller 50 makes the flashlight emitter 90 provide a pre-light emission at a known light emission amount to expose the image capturing unit 22, and reads the image signal from the image capturing unit 22.

Next, in S104, the system controller 50 determines whether the reading method of the image signal determined in S120 is the pupil division reading. When it is pupil division reading, the flow moves to S105A.

In S105A, the system controller 50 reads the A image signal (phase difference signal) from the image capturing unit 22 in S104, and reads the A+B image signal in S105B. Reading the A image signal in S104 will be referred to as readout (2), and reading the A+B image signal in S105 will be referred to as readout (3).

If it is not pupil division reading in S104, the system controller 50 moves to S105B without intervening S105A, and reads the A+B image signal.

Next, in S106, the system controller 50 performs a block integration for the A+B image signal obtained by the readout (3) in S105, and calculates the luminance level for each block using the result in addition to the result of the block integration obtained in S120 (photometric calculation).

Next, in S107, the system controller 50 extracts the exposure controlled area candidate based on the reflectance of the pre-light emission of the flashlight emitter 90.

Figure 7:
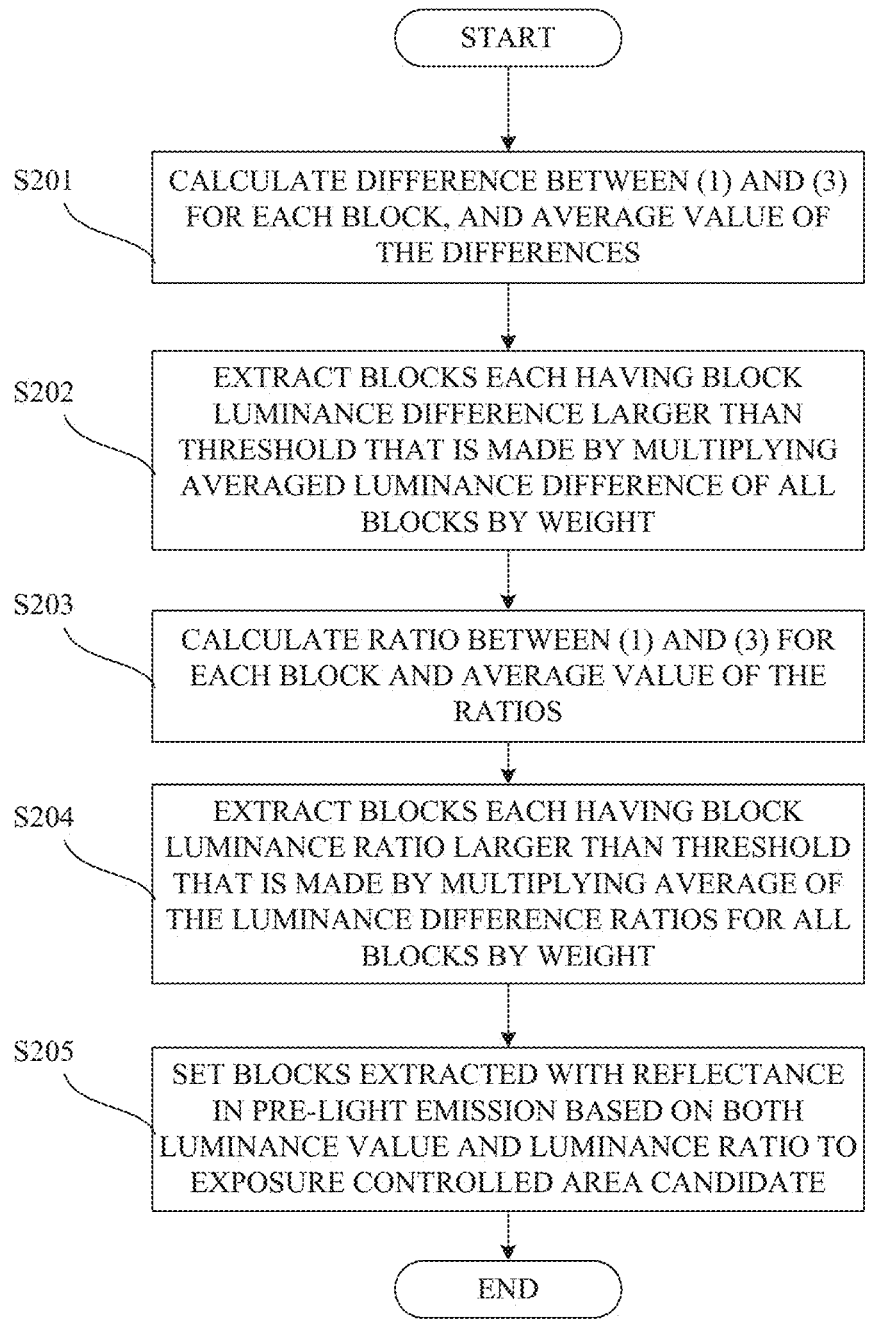
FIG. 7 is a flowchart for illustrating extraction processing of an exposure controlled area coordinate based on a reflectance in a pre-light emission according to this embodiment.
Figure 8A:
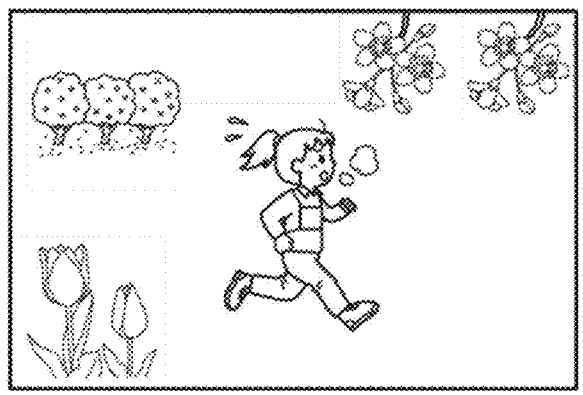
FIGS. 8A to 8C are views for explaining an extraction of a main object according to this embodiment.
Figure 8B:
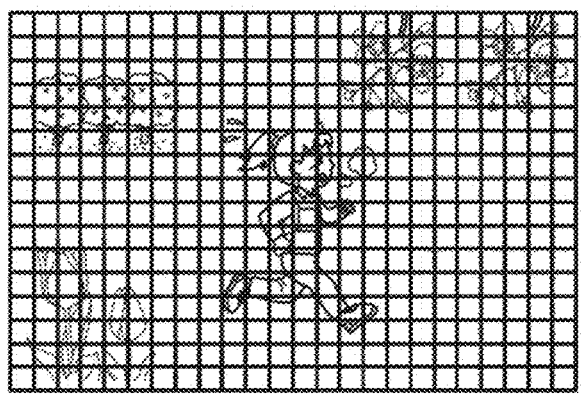

The flowchart in FIG. 7 illustrates the flow of the extracting processing of the exposure controlled area candidate based on the reflectance of this pre-light emission. In order to describe the extraction of the main object, FIG. 8A illustrates a plurality of objects contained in an image capturing angle. FIG. 8B illustrates a block for calculating an integrated value (luminance value) for each small block. Each rectangular area is a block.

In the extraction processing illustrated in FIG. 7, the block integration is performed for each block, and the result of the block integration performed for each block is used for the calculation.

In S201 in FIG. 7, the system controller 50 performs a block integration for each block illustrated in FIG. 8B for the image signal obtained by the readout (1) in S102 and the A+B image signal obtained by the readout (3) in S105 in FIG. 5. Then, the system controller 50 calculates a difference as a block integration result for each block (referred to as a "block luminance difference" hereinafter) between the image signal obtained by the readout (1) and the A+B image signal obtained by the readout (3), and an average value of all block luminance differences (referred to as an "average luminance difference" hereinafter).

Next, in S202, the system controller 50 extracts blocks each having a block luminance difference larger than a luminance difference threshold as a value made by multiplying the averaged luminance difference of all block luminance differences obtained in S201 by a predetermined weight.

Next, in S203, the system controller 50 calculates a ratio of the block integration result for each corresponding block between the image signal obtained by the readout (1) and the A+B image signal obtained by the readout (3) (which will be referred to as a "block luminance ratio" hereinafter). Moreover, the system controller 50 calculates the averaged value of all block luminance ratios (referred to as an "averaged luminance ratio" hereinafter).

Next, in step S204, the system controller 50 extracts blocks each having block luminance ratio larger than the luminance ratio threshold that is made by multiplying the averaged luminance ratio in all block luminance ratios obtained in S203 by a predetermined weight. This weight may be same as or different from the weight in S202.

Figure 8C:
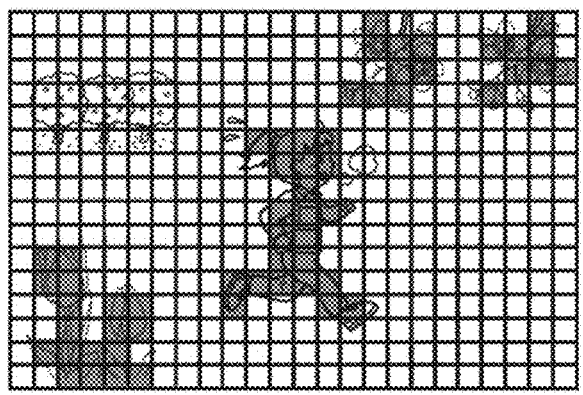

Next, in S205, the system controller 50 extracts, as the exposure area of the reflectance priority, blocks that are extracted both in S202 and S204. FIG. 8C illustrates four exposure controlled areas extracted based on the reflectance. Each extracted area is set to the exposure controlled area candidate.

Turning back to FIG. 5, in S108, the system controller 50 determines whether the reading method of the image signal determined in S120 is the pupil division reading. When it is not the pupil division reading, the system controller 50 moves to S109B. On the other hand, when it is the pupil division reading, the system controller 50 moves to S109A and calculates the focus matching information (information relating to the focusing state) using the A image signal obtained by the readout (2) and the A+B image signal obtained by the readout (3).

Figure 9:
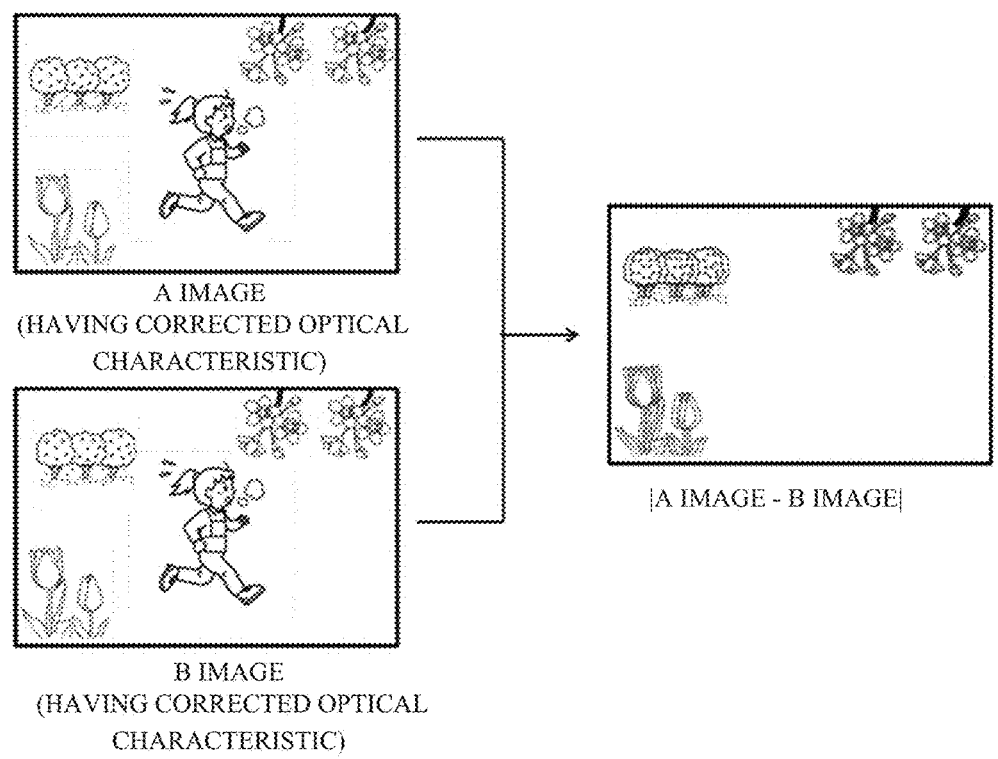
FIG. 9 is a view of an acquiring calculation illustration of focus matching information according to this embodiment.

FIG. 9 illustrates an illustrative acquisition of the focus matching information. Initially, the system controller 50 calculates the A image based on the A image signal and the B image based on the difference (B signal) between the A+B image signal and the A image signal. Herein, since the light incident on the photoelectric conversion element α that generates the A image signal and the light incident on the photoelectric conversion element β that generates the B image signal pass different areas in the image capturing lens 103, the A image and the B image are image signals that have been corrected so as to remove or mitigate the influence of this difference.

A level difference is smaller in a focused part between the A image and the B image. When an absolute value of the difference between the A image and the B image is calculated, an absolute value in a defocus part is large and the absolute value of the focused part becomes almost 0. Before the image capturing sequence is started, the AF processing is performed according to the operation (SW1 signal) of the first shutter switch 62. When the main object to be captured by the user is focused by the AF processing, the absolute value larger than almost 0 represents information indicative of the defocus or non-focus part. In other words, part having an absolute value equal to or larger than the predetermined threshold is the defocus part that is not focused. The information indicative of the defocus part is used as focus matching information to extract the exposure controlled area that is employed to calculate the light emission amount (referred to as the "main light emission amount" hereinafter) when the flash emitter 90 performs the main light emission (second light emission).

The focus matching information may not be the absolute value of the difference between the A image and the B image. For example, the focus matching information may be a difference amount with a code between the A image and the B image or distance map information generated by the known calculation used to calculate the distance (defocus amount) between the A image signal and the B image signal. After the processing in S109A, the system controller 50 moves to S109B.

In S109B, the system controller 50 extracts the exposure controlled area used for an actual exposure control calculation and calculates the contribution to the exposure control calculation for the exposure controlled area.

Figure 10:
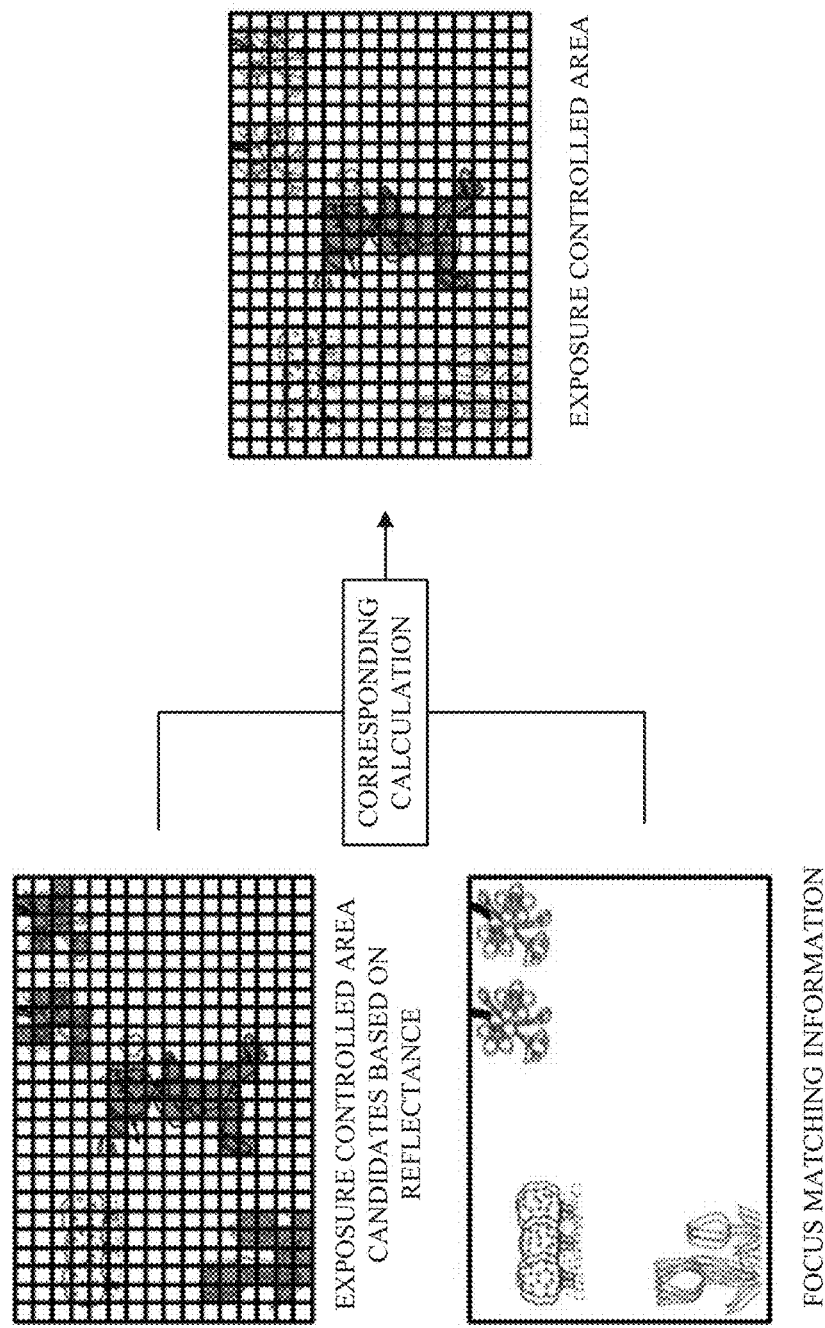
FIG. 10 is a view for illustrating extraction processing of the exposure controlled area according to this embodiment.

FIG. 10 illustrates the calculation contents used to extract the exposure controlled area candidate based on the exposure controlled area candidate extracted in S107 (when it is assumed that a plurality of candidates are extracted) and the focus matching information calculated in S109, when the reading method of the image signal determined in S120 is the pupil division reading. Initially, the system controller 50 performs (corresponding) calculation between the plurality of exposure controlled area candidates and the calculation part of the focus matching information. Then, the system controller 50 eliminates the candidate corresponding to the defocus part illustrated in the focus matching information among the plurality of exposure controlled area candidates. Thereby, the exposure controlled area is extracted.

Next, the contribution (weight) to the exposure calculation of the extracted exposure controlled area is changed according to the position on the image sensor (in the captured image) and the reflectance in the pre-light emission when the exposure controlled area candidate is extracted. More specifically, the contribution in an area having a high reflectance in the pre-light emission is made larger. In addition, the contribution in an area near the center in the captured image is made larger. Moreover, when there is detection information in the object area by the other object detector, such as a face detector, the contribution in the object area is made larger.

If no exposure controlled area is extracted as a result of extracting the above exposure controlled area, the exposure controlled area is again extracted by increasing the threshold to the absolute value of the difference between the A image and the B image which is set as defocus by the focus matching information used to eliminate the defocus exposure controlled area candidate. Nevertheless, if there is no exposure controlled area, the central weighting is used in which the contribution at the center part in the captured image is set higher and the contribution is reduced as the distance from the center part increases.

When the reading method of the image signal determined in S120 is not the pupil division reading, the system controller 50 sets any exposure object candidates based on the reflectance, to the exposure controlled area.

Turning back to FIG. 5, in S110, the system controller 50 calculates the main light emission amount so that the luminance in the exposure controlled area obtained in S109B can have a proper luminance (target luminance level) in the main image capturing. More specifically, the main light emission amount ΔhEF1 is calculated using the following expression:

$$\Delta hEF1 = \text{Log}_2 \frac{Re\ fY - DayY}{Pr\ eY - DayY} \qquad \text{Expression 1}$$

In the above expression, DayY denotes luminance level information acquired by weighting the luminance level of the exposure controlled area obtained in S109B (FIG. 10) in the A+B image signal obtained in the readout (1), with the contribution to the exposure control calculation for the exposure controlled area. PreY denotes luminance level information acquired by weighting the luminance level of the exposure controlled area in the A image signal obtained in the readout (2), with the contribution to the exposure control calculation for the exposure controlled area. RefY is a target luminance level.

ΔhEF1 obtained in this expression is a value indicating that the main light emission needs the luminance of the m-th power of 2 of the pre-light emission to properly expose the exposure controlled area.

Next, in S111, the system controller 50 prepares for the main image capturing. More specifically, the system controller 50 switches driving of the image capturing unit 22 and sets the exposure in the main image capturing. Moreover, the system controller 50 may perform the AF control based on the pair of phase difference signals by obtaining the pair of phase difference images (A image signal and B image signal) from the A image signal and the A+B image signal read out in S105A and S105B. In this case, the focus lens is driven based on the defocus amount calculated from the phase difference between the pair of phase difference images.

Next, in S112, the system controller 50 performs exposure for the main image capturing of the image capturing unit 22 and makes the flashlight emitter 90 perform the main light emission with a light emission amount based on previously calculated $\Delta hEF1$.

Next, in S113, the system controller 50 closes the shutter 101, and ends the exposure of the image capturing unit 22.

Next, in S114, the system controller 50 reads the main captured image signal from the image capturing unit 222. Herein, reading the main captured image signal will be referred to as readout (4).

Next, in S115, the system controller 50 makes the image processor 24 perform the image processing to the main captured image signal. Herein, the main captured image signal is divided into a plurality of areas and the luminance correction and WB adjustment are performed for each area based on the photometric operation result of the image signal read out of the readouts (2) and (3) and the focus matching information through the corresponding operation in S109B. More specifically, information of a ratio is acquired between the flashlight and the external light for each area based on the reflectance in the pre-light emission and $\Delta hEF1$. In addition, information of an excessive irradiation amount of the flash illumination light to the close object is obtained based on the focus matching information. The luminance correction and the WB adjustment are performed for each area based on the ratio information and excessive irradiation amount.

Thus, the image processor 24 develops and compresses the image data that has undergone the luminance correction and the WB adjustment, outputs the result to the non-volatile memory 56, and makes the display unit 28 display the result as a review image. Thus, the flash photography control processing ends.

This embodiment discusses that the flashlight emitter 90 is built in the camera 100. However, the flash photography control processing of this embodiment is applicable to case where an external flash unit (light emitter) corresponding to the flashlight emitter 90 may be attached to and detached from the image capturing apparatus.

This embodiment can utilize phase difference AF information in the pre-light emission, illuminate the object, and perform good exposure control in various image capturing scenes in the image capturing apparatus that has a plurality of pixels each including a plurality of photoelectric conversion elements for each micro lens.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-077317, filed Apr. 6, 2015 which is hereby incorporated by reference herein in its entirety.

What is claimed is:

1. An image capturing apparatus comprising:
   an image captures having a plurality of pixels each including a plurality of photoelectric conversion elements for each micro lens;
   a reader configured to read a signal from the pixel by a first signal readout in which signals from the plurality of photoelectric conversion elements are synthesized and read out and a second signal readout in which an output of a first photoelectric conversion element is read out among the plurality of photoelectric conversion elements and then an output of a second photoelectric conversion element is read out;
   a photometer configured to provide photometry using a signal read out of at least a part of pixel area that has received light from an object field;
   a light emission controller configured to make a light emitter provide a first light emission and a second light emission with a light emission amount calculated based on a result of the photometry in the first light emission, the light emitter being configured to emit light to illuminate the object field; and
   a switcher configured to switch a readout of an exposure control signal from the pixel area, between the first signal readout and the second signal readout;
   wherein the switcher switches the readout of the exposure control signal between the first signal readout and the second signal readout based on the result of the photometry in a non-light emission of the light emitter before the first light emission.

2. The image capturing apparatus according to claim 1, wherein the switcher switches the readout of the exposure control signal between the first signal readout and the second signal readout for each of the plurality of pixel areas.

3. The image capturing apparatus according to claim 1, wherein the switcher sets the readout of the exposure control signal to the first signal readout when a luminance of the object field as the result of the photometry in the non-light emission of the light emitter before the first light emission is higher than a predetermined luminance, and to the second signal readout when the luminanceof the object field is equal to or lower than the predetermined luminance.

4. The image capturing apparatus according to claim 1, further comprising:
   an exposure controller configure to calculate an exposure time period of the image capturer in the first light emission as the result of the photometry in the non-light emission time of the light emitter,
   wherein the switcher sets the readout of the exposure control signal to the first signal readout when the exposure time period is longer than a predetermined time period, and to the second signal readout when the exposure time period is equal to or shorter than the predetermined time period.

5. The image capturing apparatus according to claim 1, further comprising:
   a focus information acquirer configured to acquire information relating to a focusing state in the plurality of image areas based on a first image generated with a signal read out of the first photoelectric conversion element and a second image signal generated with a signal read out of the second photoelectric conversion element,
   wherein the focus information acquirer acquires the information relating to the focusing state using the first and second signals read by the second signal readout, when the switcher sets the readout of the exposure control signal to the second signal readout.

6. A non-transitory computer readable storage medium configured to store a computer program for a computer in an image capturing apparatus that includes an image capturer having a plurality of pixels each including a plurality of photoelectric conversion elements for each micro lens, and reads a signal from the pixel by a first signal readout in which signals from the pluralityof photoelectric conversion elements are synthesized and read out, and a second signal readout in which an output of a first photoelectric conversion element is read out among the plurality of photoelectric conversion elements and then an output of a second photoelectric conversion element is read out, the computer program enabling the computter to execute processing of;
  providing photometry using a signal read out of at least a part of pixel area that has received light from an object field;
  making a light emitter provide a first light emission and a second light emission with a light emission amount calculated based on a result of the photometry in the first light emission, the light emitter being configured to emit illumination light of the object field; and
  switching a readout of an exposure control signal from the pixel area, between the first signal readout and the second signal readout;
  wherein the switcher switches the readout of the exposure control signal between the first signal readout and the second signal readout based on the result of the photometry in a non-light emission of the light emitter before the first light emission.

* * * * *